United States Patent
Fung (10) Patent No.: US 9,201,449 B1
(45) Date of Patent: *Dec. 1, 2015

(54) METHOD AND APPARATUS FOR SOURCE-SYNCHRONOUS CAPTURE USING A FIRST-IN-FIRST-OUT UNIT

(71) Applicant: Altera Corporation, San Jose, CA (US)

(72) Inventor: Ryan Fung, Mississauga (CA)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/256,948

(22) Filed: Apr. 19, 2014

Related U.S. Application Data (63) Continuation of application No. 13/151,272, filed on Jun. 1, 2011, now Pat. No. 8,775,701, which is a continuation-in-part of application No. 11/712,143, filed on Feb. 28, 2007, now Pat. No. 8,015,382.

(60) Provisional application No. 61/396,717, filed on Jun. 2, 2010.

(51) Int. Cl.
| | |
|---|---|
| *G06F 3/00* | (2006.01) |
| *H04L 7/00* | (2006.01) |
| *H04L 7/02* | (2006.01) |
| *H04L 7/04* | (2006.01) |
| *H04L 25/38* | (2006.01) |
| *G11C 7/00* | (2006.01) |
| *G11C 8/00* | (2006.01) |
| *G06F 13/00* | (2006.01) |
| *G06F 1/12* | (2006.01) |
| *G11C 7/10* | (2006.01) |

(52) U.S. Cl.
CPC ............... *G06F 1/12* (2013.01); *G11C 7/1072* (2013.01)

(58) Field of Classification Search
CPC ......... G06F 1/12; G06F 3/061; G06F 3/0656; G06F 5/00; G06F 5/06; G06F 13/1689; G06F 13/42; G06F 13/423; G11C 7/1072; H03L 7/00
USPC ........ 710/52, 58, 61; 375/354–355, 359, 362, 375/370, 372; 365/189.01, 221, 236; 711/167; 360/47

See application file for complete search history.

(56) References Cited

U.S. PATENT DOCUMENTS

| | | |
|---|---|---|
| 4,025,772 A | 5/1977 | Constant |
| 4,233,636 A | 11/1980 | Harbaugh et al. |
| 4,785,415 A | 11/1988 | Karlquist |
| 4,873,588 A | 10/1989 | Hiramatsu |
| 5,634,043 A | 5/1997 | Self et al. |
| 6,247,137 B1 | 6/2001 | Wickeraad |
| 6,377,650 B1 | 4/2002 | Deng et al. |

(Continued)

*Primary Examiner* — Farley Abad
*Assistant Examiner* — Henry Yu
(74) *Attorney, Agent, or Firm* — L. Cho (57) ABSTRACT

A source-synchronous capture unit on a receiving circuit includes a first first-in-first-out (FIFO) unit operable to synchronize a write enable signal to generate a synchronized write enable signal that is synchronized with a first free running clock associated with a memory external to the receiving circuit. The write enable sign is generated in response to a read operation by the receiving circuit. The source-synchronous capture unit also includes a second FIFO unit operable to store data from the memory in response to the first free running clock and the synchronized write enable signal, and to output the data in response to a second free running clock associated with the receiving circuit and a read enable signal.

28 Claims, 9 Drawing Sheets

(56) References Cited

U.S. PATENT DOCUMENTS

| | | |
|---|---|---|
| 6,597,707 B1 | 7/2003 | Li |
| 6,771,552 B2 | 8/2004 | Fujisawa |
| 6,778,454 B2 | 8/2004 | Duh et al. |
| 7,123,051 B1 | 10/2006 | Lee et al. |
| 7,187,741 B2 | 3/2007 | Pontius et al. |
| 7,505,521 B2 | 3/2009 | Cho et al. |
| 7,646,668 B2 | 1/2010 | Udell et al. |
| 7,808,855 B1 | 10/2010 | Zhang et al. |
| 7,966,468 B1 | 6/2011 | Simeral et al. |
| 8,015,382 B1 | 9/2011 | Fung |
| 8,775,701 B1 | 7/2014 | Fung |
| 2002/0141525 A1* | 10/2002 | Behrens et al. .......... 375/372 |
| 2004/0104749 A1 | 6/2004 | Yeh |
| 2004/0120189 A1 | 6/2004 | Schauer |
| 2005/0138456 A1* | 6/2005 | Song .......................... 713/400 |

* cited by examiner

METHOD AND APPARATUS FOR SOURCE-SYNCHRONOUS CAPTURE USING A FIRST-IN-FIRST-OUT UNIT

RELATED APPLICATIONS

This application is a continuation of and claims benefit and priority to U.S. application Ser. No. 13/151,272 filed on Jun. 1, 2011 entitled, "Method and Apparatus for Source-Synchronous Capture Using a First-In-First-Out Unit", which is a continuation-in-part of and claims benefit and priority under Title 35, United States Code, Section 120 of co-pending U.S. Pat. No. 8,015,382 filed on Feb. 28, 2007 entitled "Method and Apparatus for Strobe-Based Source-Synchronous Capture Using a First-In-First-Out Unit" and provisional U.S. Patent Application Ser. No. 61/396,717 filed Jun. 2, 2010, entitled "Low-Latency External Memory Interface for FPGAs That Support Multiple Standards", the full and complete subject matter of which is hereby expressly incorporated by reference in its entirety.

FIELD OF THE INVENTION

Embodiments of the present invention relate to hardware for supporting source synchronous standards. More specifically, embodiments of the present invention relate to a method and apparatus for strobe-based source-synchronous capture using a first-in-first-out (FIFO) buffer.

BACKGROUND OF THE INVENTION

Source synchronous communication standards are important to enable high-speed data transfer between devices. Board skews and delay variation make it challenging to complete a synchronous transfer with a single central board clock or even a single clock forwarded with a large number of data bits. Consequently, what is typically done is a large data bus is divided into small groups of bits and a clock or strobe associated with each group of bits is forwarded along with the respective data. An assumption is made that any board skew or delay variation will affect both the clock or strobe and data bits in each group such that the clock or strobe can be reliably used to capture the respective data.

One issue with this approach is that data synchronized to various different clocks or strobes must often be synchronized to a single clock in the receiving device to facilitate data processing on all the data received. There are a few known approaches that have been used to achieve this in programmable-logic devices (PLDs), or, more specifically, field-programmable gate arrays (FPGAs).

Run-time controllable delay chains may be used on the input data paths to delay the data as necessary so it can be successfully captured by a single clock in the receiving device. To achieve this, it is important to determine the phase relationship between the incoming data and the clock in the receiving device. This can be done on a group basis (data bits and associated clock/strobe) by sampling different delayed versions of the clock/strobe with the clock in the receiving device. Using that information, the data can be appropriately delayed to facilitate reliable capture. The disadvantage of this approach is the complexity associated with the hardware needed to support dynamic delay calibration to adjust delays for process/voltage/temperature variations. There can be additional complexity in the controller logic to keep the data capture reliable and ensure all the data is aligned.

In another approach, the clock within the receiving device can be adjusted so that the data can be reliably transferred directly from the clock/strobe domains to the receiving device clock domain. This approach may be combined with circuitry (in the IO periphery of FPGAs) that capture the data using the strobe and de-serialize it so that the data is still synchronous to the strobe, but it toggles at a more manageable frequency (which is desirable for FPGAs that have slower core logic speeds than comparable ASICs). That lower-frequency data is then re-synchronized to a receiving device clock domain. A disadvantage with this approach is that it can be difficult if not impossible to determine a single clock phase within the receiving device that will suit all the clock/strobe domains at high speeds.

SUMMARY

According to an embodiment of the present invention, a FIFO unit is used to perform re-synchronization of data from a non-free-running strobe domain or a memory device clock domain to a receiving device clock domain to complete a source synchronous transfer. The FIFO unit includes a write clock port and a read clock port which can be connected to (phase) independent clocks. Data may be written into the write side of the FIFO, and data may be read out on the read side of the FIFO in the same order which the data was written. The FIFO unit performs resynchronization without requiring components such as specially-calibrated data-path delay elements, hardware which supports dynamic delay calibration of those delay elements, state machines which keep data aligned, and clock-phase re-calibration circuitry. This approach also avoids the timing marginality associated with transferring data directly and synchronously from multiple domains to a single clock domain that may be difficult to determine. The FIFO units handle these transfers asynchronously, and independently, so no timing window interactions need to be considered.

According to an embodiment of the present invention, re-synchronization of data from a free running clock may also be performed by a source synchronous capture unit. The source synchronous capture unit utilizes a first FIFO unit to synchronize a write enable signal from the receiving device clock domain to the transmitting device clock domain to generate a synchronized write enable signal. The write enable signal may be generated in response to a read operation by the receiving circuit. The source synchronous capture unit also utilizes a second FIFO unit such as the FIFO unit described above. Data is written into the second FIFO unit in response to the synchronized write enable signal. By writing data into the second FIFO unit in response to the synchronized write enable signal, invalid data is prevented from being written into the second FIFO unit.

BRIEF DESCRIPTION OF THE DRAWINGS

The features and advantages of embodiments of the present invention are illustrated by way of example and are not intended to limit the scope of the embodiments of the present invention to the particular embodiments shown.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, and components are shown in block diagram form to avoid obscuring embodiments of the present invention unnecessarily.

Figure 1:
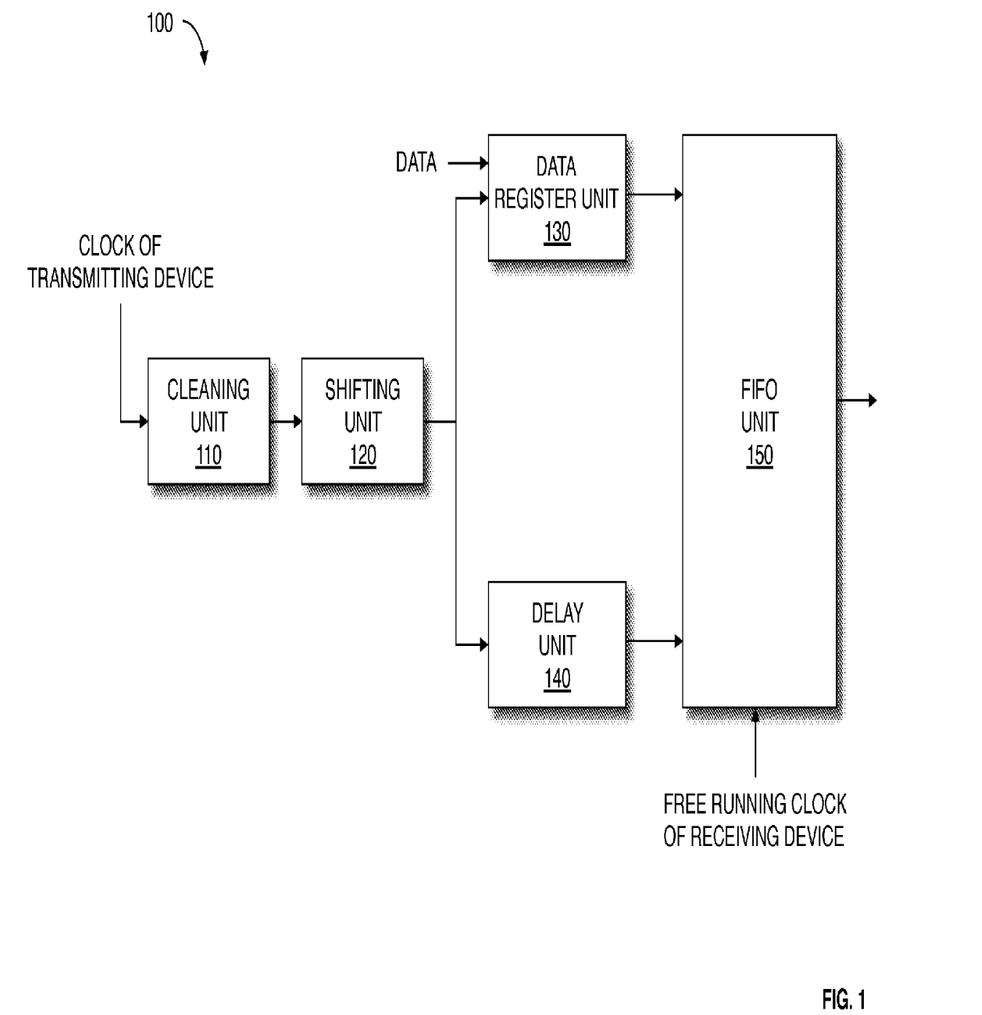
FIG. 1 is a block diagram of a source synchronous capture unit according to an exemplary embodiment of the invention.

FIG. 1 is a block diagram of a source synchronous capture unit 100 according to an exemplary embodiment of the invention. The source synchronous capture unit 100 may be used at a receiving device to capture source synchronous data from a transmitting device and to synchronize the data to a receiving device clock. The source synchronous capture unit 100 can support source-synchronous communication standards, such as double-data-rate (DDR), that do not send a free-running clock along with the data. A non-free running clock, such as a strobe, may be transmitted with the data that toggles when the data is being sent. The source synchronous capture unit 100 may include a cleaning unit 110, when non-free running clocks are being processed. The cleaning unit 110 adjusts the non-free running clock so that it may be used directly for capturing data. According to an embodiment of the present invention, the cleaning unit 110 may be removed or bypassed when the system uses a free-running clock. The cleaning unit 110 may gate the non-free running clock with logic that performs an AND function and a control (enable) signal that is timed to be high when the non-free running clock is active. It should be appreciated that other techniques, such as electrical methods based on level detection of the non-free running clock to interpret an intermediate voltage level as high or low, may be used to clean up the non-free running clock.

The source synchronous capture unit 100 includes a shifting unit 120. The shifting unit 120 shifts the clock or strobe to facilitate data capture so that the edges of the clock or strobe are centered in the data valid window, in one embodiment. According to one embodiment, a delay lock loop may be used to calibrate a delay chain to shift the clock or strobe. It is appreciated that other techniques may be used to shift the clock or strobe.

Figure 2:
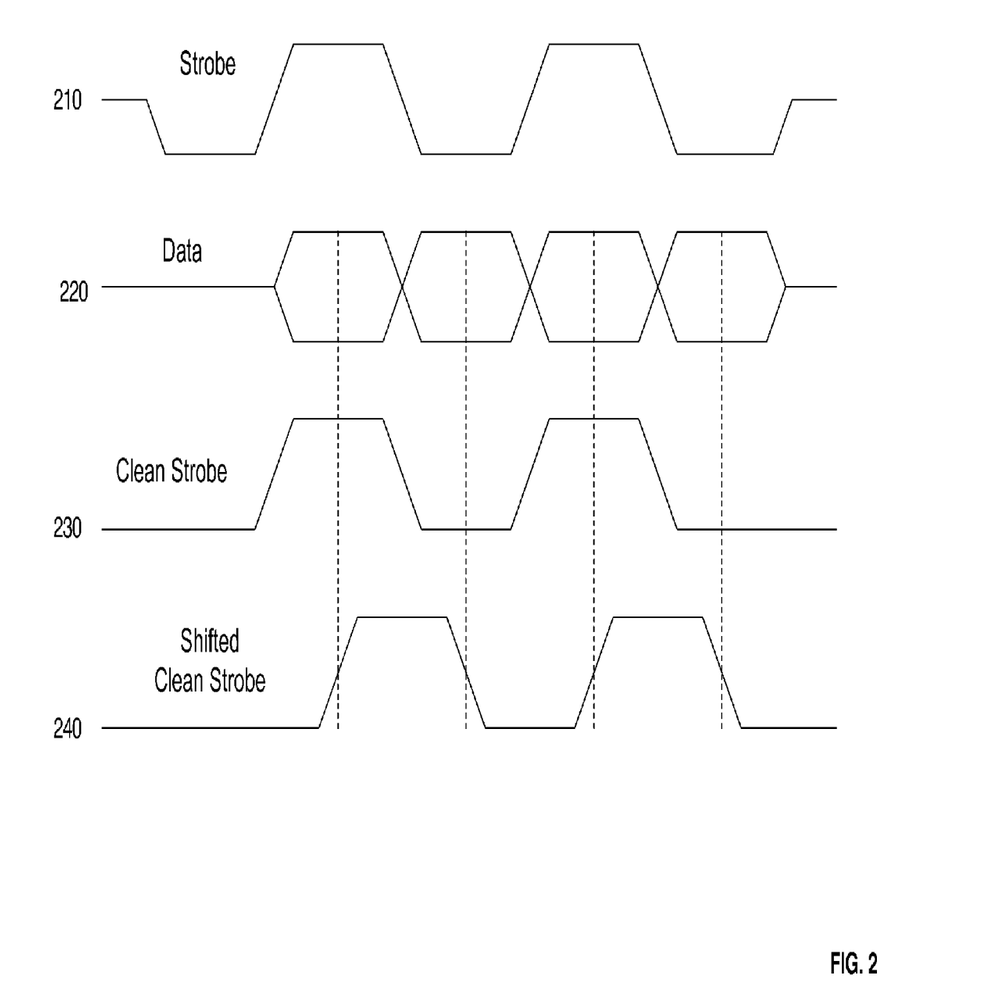
FIG. 2 is a timing diagram illustrating strobe signal adjustment by a source synchronous capture unit according to an embodiment of the present invention.

FIG. 2 is a timing diagram illustrating how a strobe signal is adjusted by a source synchronous capture unit according to an embodiment of the present invention. Signal 210 is a strobe signal which is used for a non-free running clock. Signal 220 is a data signal. In some strobe-based applications, the strobe may go tri-state when data is not being read or written. In those cases, it is difficult to make use of the strobe directly for capturing data. Signal 230 is a clean strobe signal. The clean strobe signal 230 represents the strobe signal 210 after being adjusted by a cleaning unit. Signal 240 is a shifted clean strobe signal. The shifted clean strobe signal 240 represents the clean strobe signal 230 after being adjusted by a shifting unit. As shown in FIG. 2, data from the data signal 220 may be captured by every edge of the shifted clean strobe signal 240 after being processed by the cleaning unit and shifting unit 120 of a source synchronous capture unit. After the data capture, the data can be de-serialized such that two bits become available at a negative clock edge, for example.

Referring back to FIG. 1, the source synchronous capture unit 100 includes a data register unit 130. The data register unit 130 is coupled to a first line that carries data and a second line that carries a non-free running clock (that may be cleaned by the cleaning unit 110 and shifted by the shifting unit 120). The data register unit 130 registers data clocked in by the clock or strobe. Registering incoming source synchronous data is important because transfers from an input/output (JO) pin to a core of the receiving device may introduce additional skew between the non-free running clock and the data that may cause capture failures of the data in the core, using the clock or strobe. Registering (or re-registering) the data in the FPGA IO periphery reduces data timing drift relative to the clock or strobe that may have happened outside of the FPGA. As such, the data transfer from the FPGA IO periphery into the FPGA core has more margin after the registering. Another advantage of the registering is that de-serialization can be easily done at the same time.

The source synchronous capture unit 100 includes a delay unit 140. The delay unit 140 is coupled to the shifting unit 120 and receives the clock or strobe. The delay unit 140 adds clock skew to delay the clock or strobe signal. The delay unit 140 may be implemented using hardware components dedicated to producing a delay. Alternatively, the delay unit 140 may be implemented using programmable routing. The delay unit 140 allows data to be written into a FIFO using the same clock edge that is used to capture the data by the data register unit 130. This is important since a non-free running clock, such as a strobe, may not be a continuous clock. For example, consider a receiving device that performs a double-data rate capture and de-serialization into a single-data rate, all synchronized to a non-free running clock, such as a strobe. If 4 bits of data are being received, there will only be 4 edges of the strobe (rising then falling then rising then falling). Two bits of data are made available at the data register unit 130 every negative edge of the strobe. After the second negative edge of the strobe, the last two bits of data are still at the data register unit 130 and only the first two bits of data have been written into the FIFO unit. When the strobe stops, the last two bits of data will be "stranded" at the data register unit 130. The delay unit 140 allows the source synchronous capture unit 100 to prevent stranding bits of data at the data register unit 130 by having data written into the FIFO unit use the same clock edge that is used to capture the data at the data register unit 130. All the data gets written into the FIFO unit when the non-free running clock stops toggling.

According to an embodiment of the source synchronous capture unit 100, the data has "Delay" worth of time to travel from the data register unit 130 to the FIFO. If "Delay" equals a period of the clock or strobe, the data has one period to travel. If "Delay" is larger, the data has even more time. In order to prevent data corruption at the FIFO, there is a minimum data travel time of "Delay" minus the clock or strobe period.

The source synchronous capture unit 100 includes a FIFO unit 150. The FIFO unit 150 may include the features described above. The FIFO unit 150 writes (stores) data received from the data register unit in response to the clock or strobe and reads (outputs) the data stored in the FIFO unit 150 in response to a free running clock on the receiving device. The FIFO unit 150 may be implemented by one or more FIFOs. According to an embodiment of the present invention, the FIFO unit 150 may be an asynchronous FIFO unit that includes one or more asynchronous FIFOs.

Figure 3:
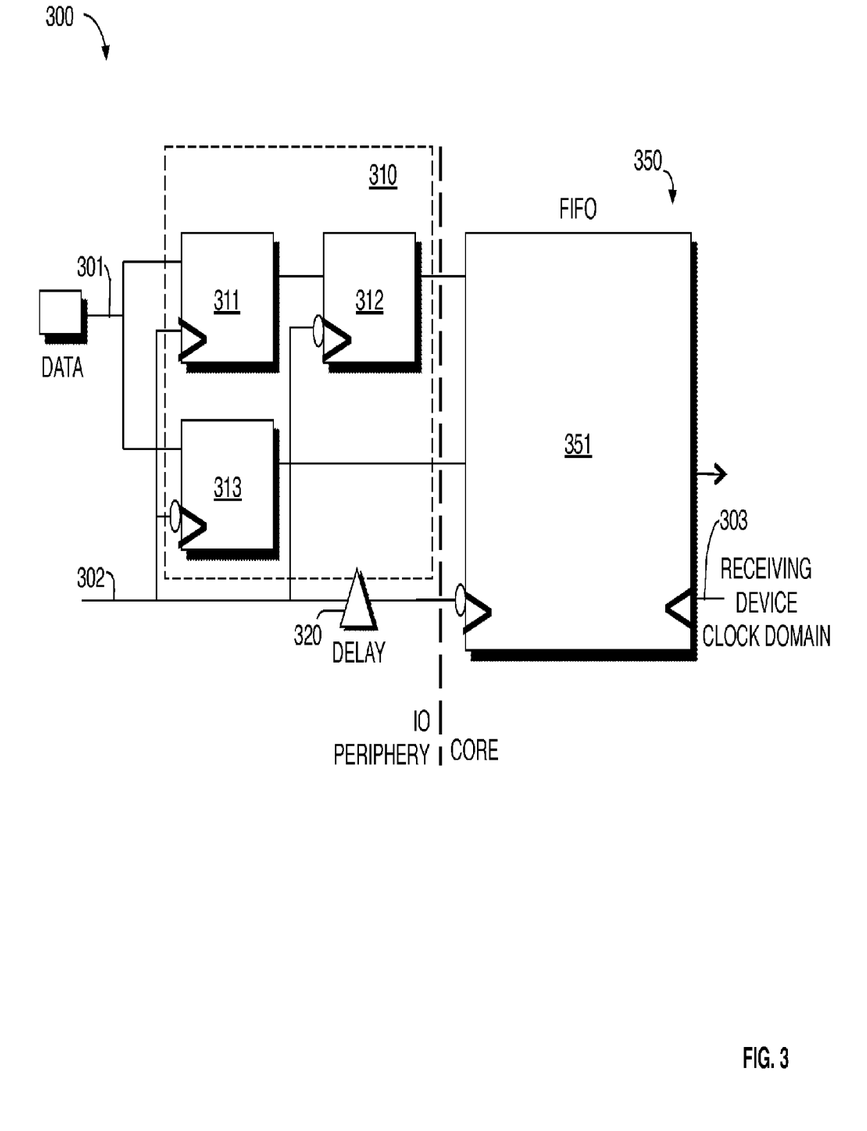
FIG. 3 illustrates a portion of a source synchronous capture unit implementing a single FIFO according to an exemplary embodiment of the present invention.

FIG. 3 illustrates a source synchronous capture unit 300 implementing a single FIFO according to an embodiment of the present invention. The components illustrated in FIG. 3 may be used to implement portions of the source synchronous capture unit 100 illustrated in FIG. 1. The source synchronous capture unit 300 includes a data register unit 310. The data register unit 310 includes a plurality of registers 311-313 that are coupled to a first line 301 that carries data and a second line 302 that carries a clock or strobe. According to one embodiment, the second line 302 carries a strobe that has been cleaned and shifted. The data register unit 310 captures data received from the first line 301 and is synchronized to the clock or strobe on the second line 302.

The source synchronous capture unit 300 includes a delay unit 320. The delay unit 320 is coupled to the second line 302 that carries the clock or strobe. The delay unit 320 adds a delay to the clock or strobe that is transmitted to a FIFO unit 350 in the source synchronous capture unit 300. The delay added to the clock or strobe allows data to be written to the FIFO unit 350 using the same clock edge that is used to capture the data by the register unit 310.

The source synchronous capture unit 300 includes the FIFO unit 350. The FIFO unit 350 implements a single FIFO 351 according to an exemplary embodiment of the present invention. The FIFO 351 has a read side and a write side. The write side of the FIFO 351 receives the clock or strobe from the delay unit 320 and writes data into the FIFO 351 from the data register unit 310 in response to the clock or strobe. The read side of the FIFO 351 is coupled to a third line 303 that carries a clock associated with the receiving device and reads data out from the FIFO 351 in response to the clock associated with the receiving device. It should be noted that in some embodiments the FIFO is implemented out of programmable core logic. This permits a variety of FIFO implementations and avoids permanent area penalty associated with dedicated FIFOs. According to an embodiment of the present invention, the FIFO unit 350 may be an asynchronous FIFO unit that implements a single asynchronous FIFO 351.

Figure 4:
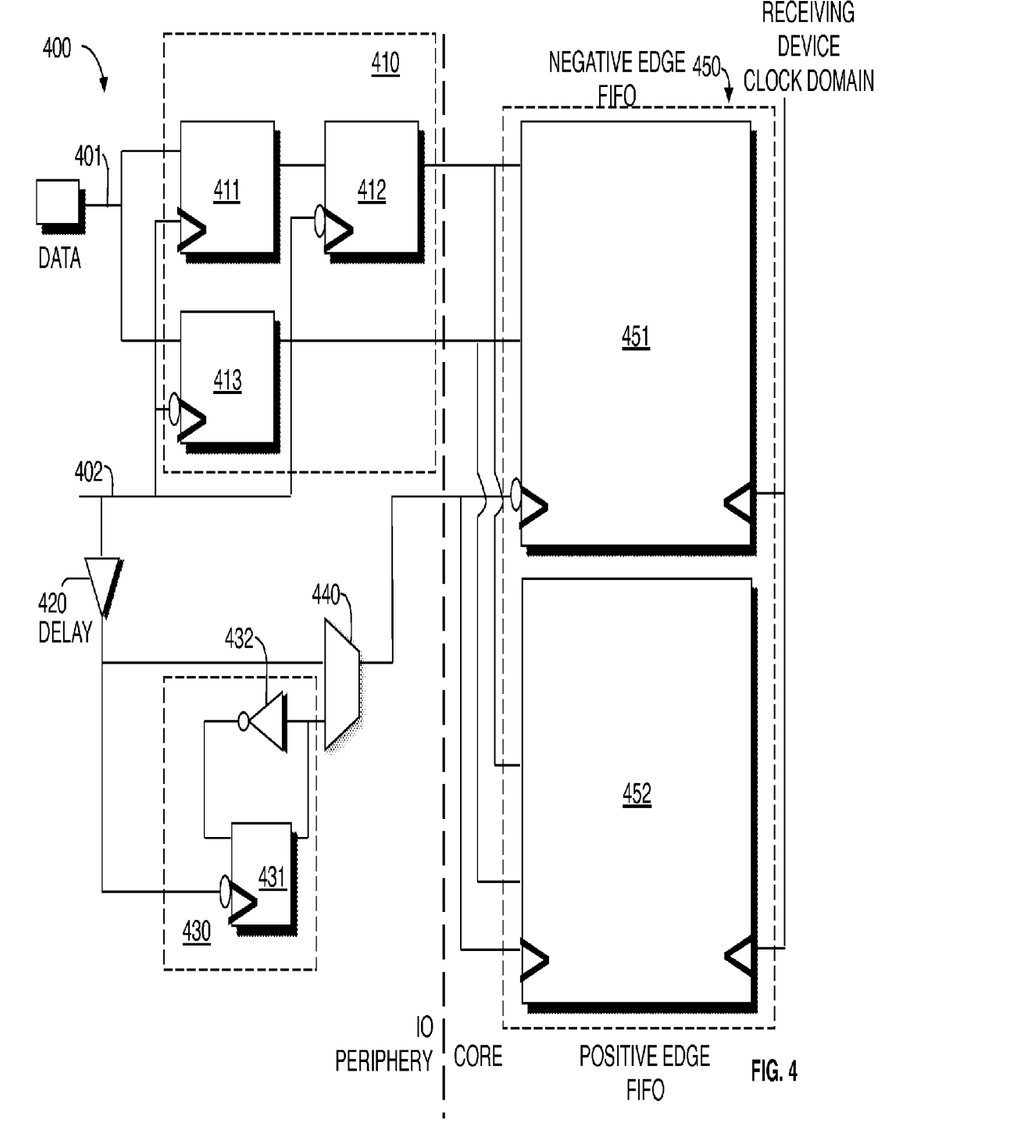
FIG. 4 illustrates a portion of a source synchronous capture unit implementing two FIFOs according to an exemplary embodiment of the present invention.

FIG. 4 illustrates a source synchronous capture unit 400 implementing two FIFOs according to an exemplary embodiment of the present invention. The components illustrated in FIG. 4 may be used to implement portions of the source synchronous capture unit 100 illustrated in FIG. 1. The source synchronous capture unit 400 includes a data register unit 410 similar to data register unit 310 shown in FIG. 3. The data register unit 410 includes a plurality of registers 411-413 that are coupled to a first line 401 that carries data and a second line 402 that carries a clock or strobe. According to one embodiment, the second line 402 carries a strobe that has been cleaned and shifted. The data register unit 410 captures data received from the first line 401 and is synchronized to the clock or strobe on the second line 402.

The source synchronous capture unit 400 includes a delay unit 420 similar to the delay unit 320 shown in FIG. 3. The delay unit 420 is coupled to the second line 402 that carries the clock or strobe. The delay unit 420 adds a delay to the clock or strobe that is transmitted to an FIFO unit 450 in the source synchronous capture unit 400. The delay added to the clock or strobe allows data to be written to the FIFO unit 450 using the same clock edge that is used to capture the data by the register unit 410.

The source synchronous capture unit 400 includes a divider unit 430. The divider unit 430 receives the clock or strobe from the delay unit 420 and divides the clock or strobe. The divider unit 430 is implemented by a register 431 and an inverter 432.

The source synchronous capture unit 400 includes the FIFO unit 450. The FIFO unit 450 implements two FIFOs 451 and 452 according to an exemplary embodiment of the present invention. The FIFO 451 operates off the negative edge of the clock or strobe and FIFO 452 operates off the positive edge of the clock or strobe. This allows the FIFOs 451 and 452 to operate at a lower frequency than the data bits are being captured at by the data register unit 410.

The speed at which logic can run in a programmable logic device may limit the maximum speed the FIFOs can operate at. The configuration of the source synchronous capture unit 400 allows data to be written into the FIFOs 451 and 452 at half the rate of the clock or strobe. Data is written into alternating FIFOs, every falling edge of the clock or strobe. In some embodiments, the FIFO speed need only be a quarter of the incoming data rate (the data is de-serialized in the register unit and again when being written to the FIFOs).

The FIFOs 451 and 452 each have a read side and a write side. The write side of the FIFOs 451 and 452 receive the clock or strobe from the delay unit 420 and write data into the FIFOs 451 and 452 from the data register unit 410 in response to the clock or strobe. The read side of the FIFOs 451 and 452 are fed by a clock in the receiving device, and read data out from the FIFOs 451 and 452 in response to the receiving-device clock.

The source synchronous capture unit 400 may optionally include a multiplexer 440. The multiplexer 440 may be used to select one of either the clock or strobe signal from line 402 or a divided clock or strobe from the divider unit 430. In a situation where the clock or strobe rate is supported by the speed at which logic can run in a programmable logic device, the clock or strobe signal from line 402 may be directly selected by the multiplexer 440 and only 1 FIFO can be used as illustrated in FIG. 3. This avoids introducing additional logic when it is unneeded. According to an embodiment of the present invention, the FIFO unit 450 may be an asynchronous FIFO unit implementing two asynchronous FIFOs 451 and 452.

Figure 5:
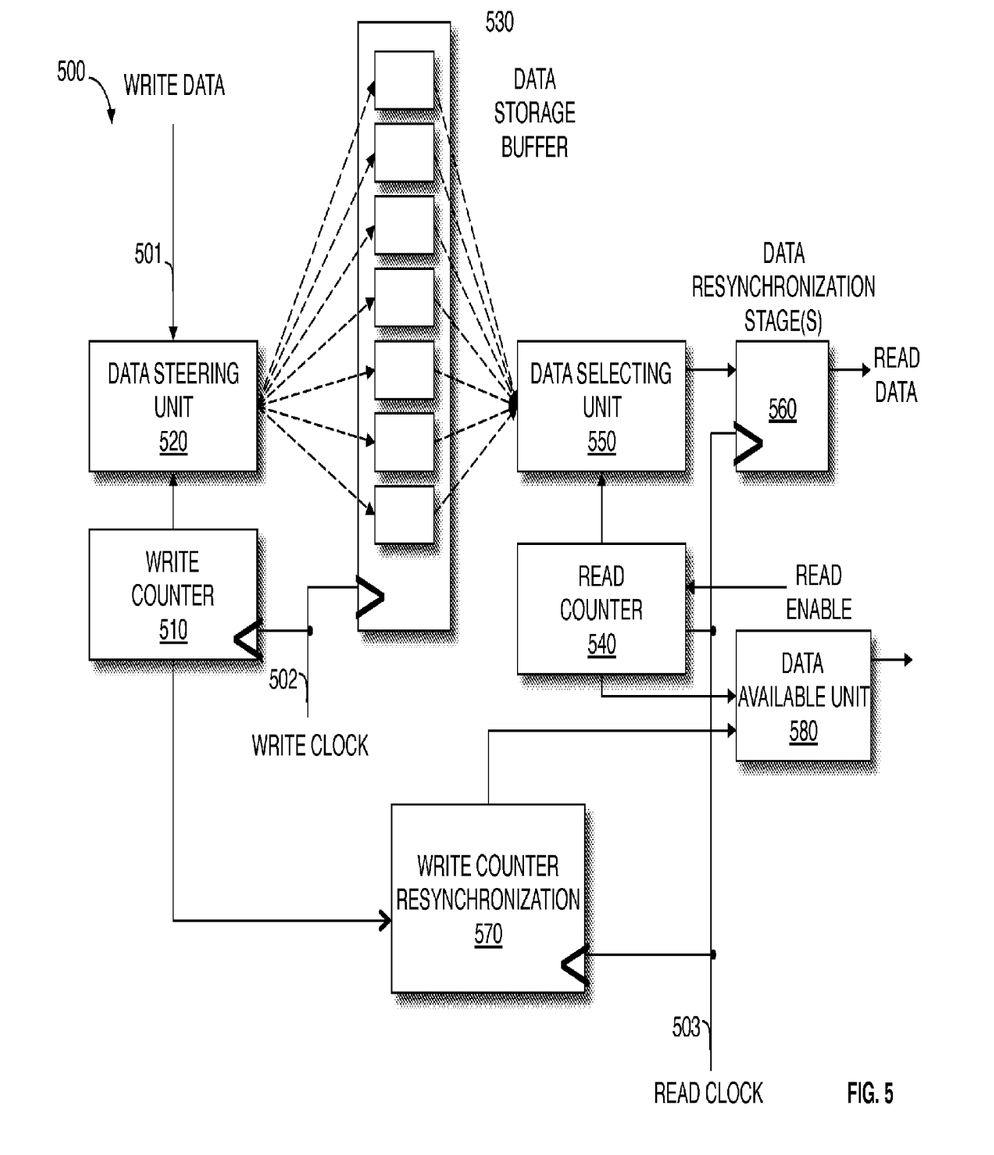
FIG. 5 illustrates the components in a FIFO according to an exemplary embodiment of the present invention.

FIG. 5 illustrates the components in a FIFO 500 according to an exemplary embodiment of the present invention. The FIFO 500 may be used to implement any one of the FIFOs shown in FIGS. 3 and 4. The FIFO 500 receives data (labeled "Write Data") from a first line 501, a clock or strobe signal (labeled "Write Clock") from a second line 502, and a receiving device clock (labeled "Read Clock") from a third line 503.

The FIFO 500 includes a write counter 510. The write counter 510 receives the clock or strobe and increments its counter value with every rising or falling edge from the clock or strobe. According to an embodiment of the FIFO 500, the write counter 510 is a Gray counter.

The FIFO 500 includes a data steering unit 520. The data steering unit 520 is coupled to the first line 501 and receives data. The data steering unit 520 is coupled to the write counter 510 and receives counter values. The data steering unit 520 steers the data received to the appropriate element (storage locations) in a data storage buffer in response to the counter values.

The FIFO 500 includes a data storage buffer 530. The data storage buffer 530 includes a plurality of elements. The data storage buffer 530 is coupled to the clock or strobe and clocks data from the data steering unit 510 in response to the clock or strobe.

The FIFO 500 includes a read counter 540. The read counter 540 is coupled to the third line 503 and receives the receiving device clock. The read counter 540 increments its counter value in response to the receiving device clock signal and a read enable signal that indicates that data had previously been read out successfully. According to an embodiment of the FIFO 500, the read counter 540 is a Gray counter.

The FIFO 500 includes a data selecting unit 550. The data selecting unit 550 is coupled to the read counter 540 and receives counter values. The data selecting unit 550 selects which element (storage location) in the data storage buffer to select to read from in response to the counter values.

The FIFO 500 includes a data resynchronization stage 560. The data resynchronization stage 560 resynchronizes data from the domain of the clock or strobe (the "Write Clock" domain) into the domain of the receiving device clock (the "Read Clock" domain) so that the receiving device domain ("Read Clock" domain) can present the data synchronized to the receiving device clock.

The FIFO 500 includes a write counter resynchronization unit 570. The write counter resynchronization unit 570 is coupled to the third line 503 and receives the receiving device clock. The write counter resynchronization unit 570 resynchronizes the write counter state into the receiving device domain (the "Read Clock" domain). To implement the data resynchronization stage 560 and the write counter resynchronization unit 570, cascades of registers for each bit being re-synchronized may be used. For example, some embodiments may use two registers in series for each bit being re-synchronized. The first register captures the data into the "new" clock domain, if the data changes at a clock edge, the register may go meta-stable for a short while. The purpose of the second register is to pass only the final decision of that first register once it has stabilized, and filter out the instability. The second register can be the output of the resynchronization unit. It will have stable data synchronized to the "new" clock domain.

The FIFO 500 includes a data availability unit 580. The data availability unit 580 compares the re-synchronized write counter values with the read counter values to determine whether data is available for reading from the data storage buffer 530. If data is available for reading, the data available unit 580 generates an indication that the data from the data resynchronization stage 560 is valid.

According to an embodiment of the present invention, the FIFO 500 is implemented such that the last data written to the FIFO 500 can be read even if the non-free running clock (Write Clock) stops. That is, the FIFO 500 should not have any write latency. This is important to avoid "stranding" data when the non-free running clock stops. The depth of the data storage buffer 530 can be sized so that there is reduced chance of overflow (based on the application and the environment the FIFO 500 is run in). If it is assumed that data will be read from the FIFO 500 as soon as all the elements in the FIFO 500 have the relevant data, the depth will mainly be a function of the maximum inter-strobe skews. As long as the FIFO 500 is sized appropriately, there is no need for an overflow or full signal. Consequently, the only ports the FIFO 500 needs is a write data port (for receiving data), write clock (for the clock or strobe), read data port, read clock (for the receiving device clock), and a data available flag.

There is an important timing consideration for the FIFO 500. The timing of various paths must be met in order to ensure that the read data is valid when an indication is generated by the data available unit 580 that the read data is valid. For example, when the FIFO 500 transitions from being empty to having some data, the valid data needs to be available at the output of the data resynchronization stage unit 560 when the write counter resynchronization unit 570 presents the up-to-date write counter state to the data available unit 580. According to an embodiment of the present invention, this may be achieved by delaying the path from the write counter 510 to the write counter resynchronization unit 570. According to an alternate embodiment of the present invention, the delay from the data storage buffer 530 to the data resynchronization stage unit 560 may be reduced. According to another embodiment of the present invention, the skew on the clock or strobe may be adjusted to delay the update of the write counter 510 relative to when data is written into the data storage buffer 530. It is appreciated that the FIFO 500 may be implemented as an asynchronous FIFO.

Referring back to FIG. 1, according to an alternate embodiment of the present invention, when receiving a free-running clock with data, shifting unit 120 and delay unit 140 may shift and add clock skew to free running clock signals similar to the shift and add clock skew to non-free running clock signals as described with respect to the earlier described embodiment above. In these embodiments, cleaning unit 110 is typically not required to adjust the clock signal because the free-running clock does not go to tri-state. Furthermore, FIFO unit 150 operates to write (store) data received in response to a first free running clock corresponding to the transmitting device and a write enable signal that is synchronized. The FIFO unit 150 also operates to output the data stored in response to a second free running clock corresponding to the receiving device.

Figure 6:
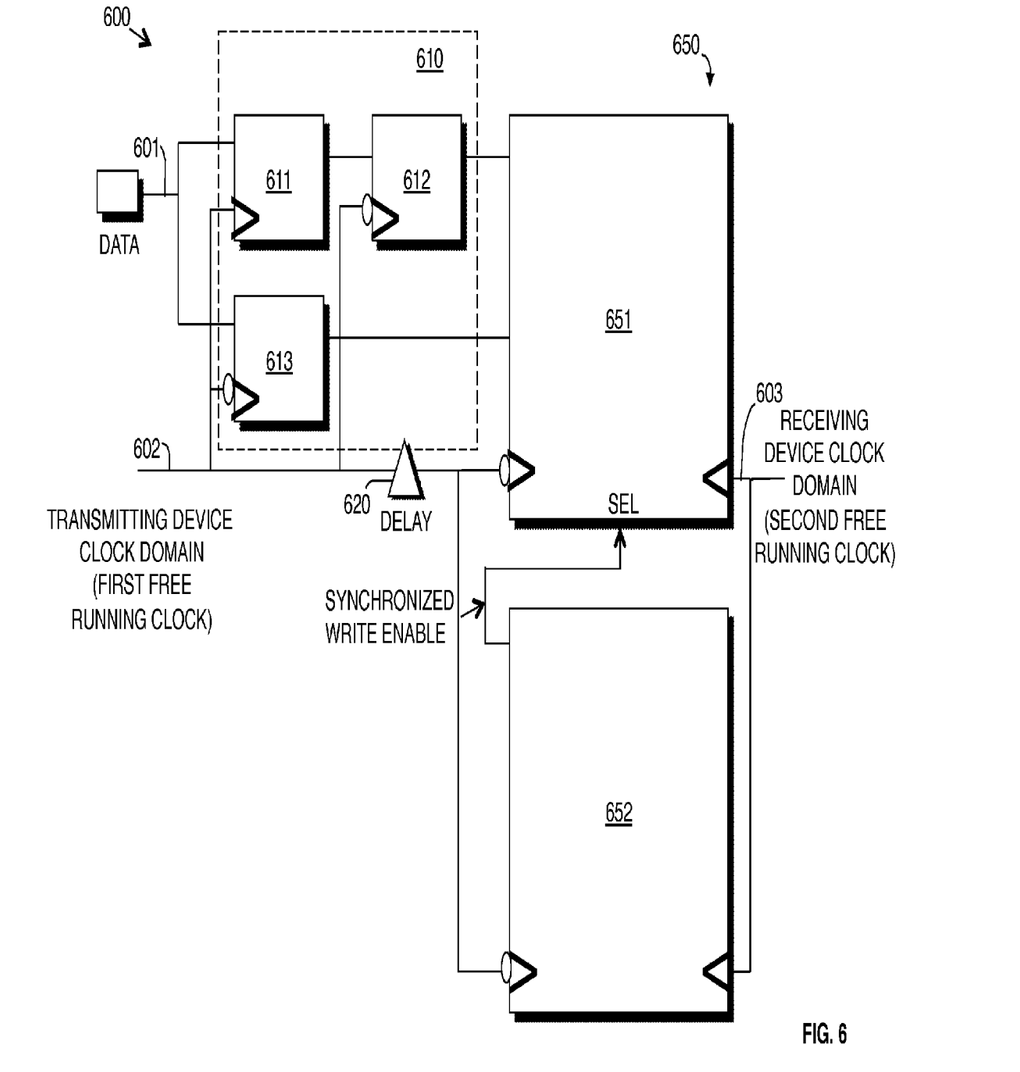
FIG. 6 illustrates a portion of a source synchronous capture unit operable to synchronize data transmitted along with a free running clock according to an exemplary embodiment of the present invention.

FIG. 6 illustrates a source synchronous capture unit 600 operable to synchronize data transmitted with a free running clock according to an exemplary embodiment of the present invention. The source synchronous capture unit 600 receives data that is synchronized with a first free running clock associated with a transmitting device. The source synchronous capture unit 600 synchronizes the data with a second free running clock that is associated with a receiving device. The components illustrated in FIG. 6 may be used to implement portions of the source synchronous capture unit 100 illustrated in FIG. 1.

The source synchronous capture unit 600 includes a data register unit 610. The data register unit 610 includes a plurality of registers 611-613 that are coupled to a first line 601 that carries data and a second line 602 that carries a free running clock signal from the first free running clock. According to an embodiment of the present invention, the registers may be implemented using flip-flops. The data and the free running clock signal may originate from a transmitting device residing external to a receiving device which the source synchronous capture unit resides on. According to one embodiment, the second line 602 carries a first free running clock signal that has been shifted. The data register unit 610 captures data received from the first line 601 and is synchronized to the first free running clock on the second line 602.

The source synchronous capture unit 600 includes a delay unit 620. The delay unit 620 is coupled to the second line 602 that carries the first free running clock. The delay unit 620 adds a delay to the first free running clock that is transmitted to a FIFO unit 650 in the source synchronous capture unit

600. The delay added to the first free running clock allows data to be written to the FIFO unit 650 using the same clock edge that is used to capture the data by the register unit 610.

The FIFO unit 650 includes a first FIFO 652. The first FIFO 652 may be referred to as an "enable FIFO". The first FIFO 652 has a read side and a write side. The write side of the first FIFO 652 is coupled to a third line 603 that carries a second free running clock signal from a second free running clock associated with the receiving device. The write side of the first FIFO 652 writes write enable signals into the FIFO 652 transmitted by the receiving device in response to the second free running clock signal. According to an embodiment of the present invention, the write enable signals from the receiving device are generated in response to a read operation. The read side of the first FIFO 652 receives the first free running clock signal from the delay unit 620 and reads out a synchronized write enable signal in response to the first free running clock signal.

The FIFO unit 650 includes a second FIFO 651. The second FIFO 651 may be referred to as a "data FIFO". The second FIFO 651 has a read side and a write side. The write side of the second FIFO 651 receives a first free running clock signal from the delay unit 620 and writes data into the second FIFO 651 from the data register unit 610 in response to the first free running clock and a synchronized write enable signal from the first FIFO 652. The read side of the second FIFO 651 is coupled to the third line 603 that carries the second free running clock associated with the receiving device. Data is read out from the second FIFO 651 in response to the second free running clock associated with the receiving device. According to an embodiment of the present invention, the FIFO unit 650 may be an asynchronous FIFO unit that implements asynchronous FIFOs 651 and 652.

By writing data into the second FIFO 651 in response to the synchronized write enable signal from the first FIFO 652, the source synchronous capture unit 600 will write valid data into the second FIFO 651. This approach differs from prior art approaches which would write data into a data FIFO every cycle of a free running clock, regardless of whether the data was valid or not.

Figure 7:
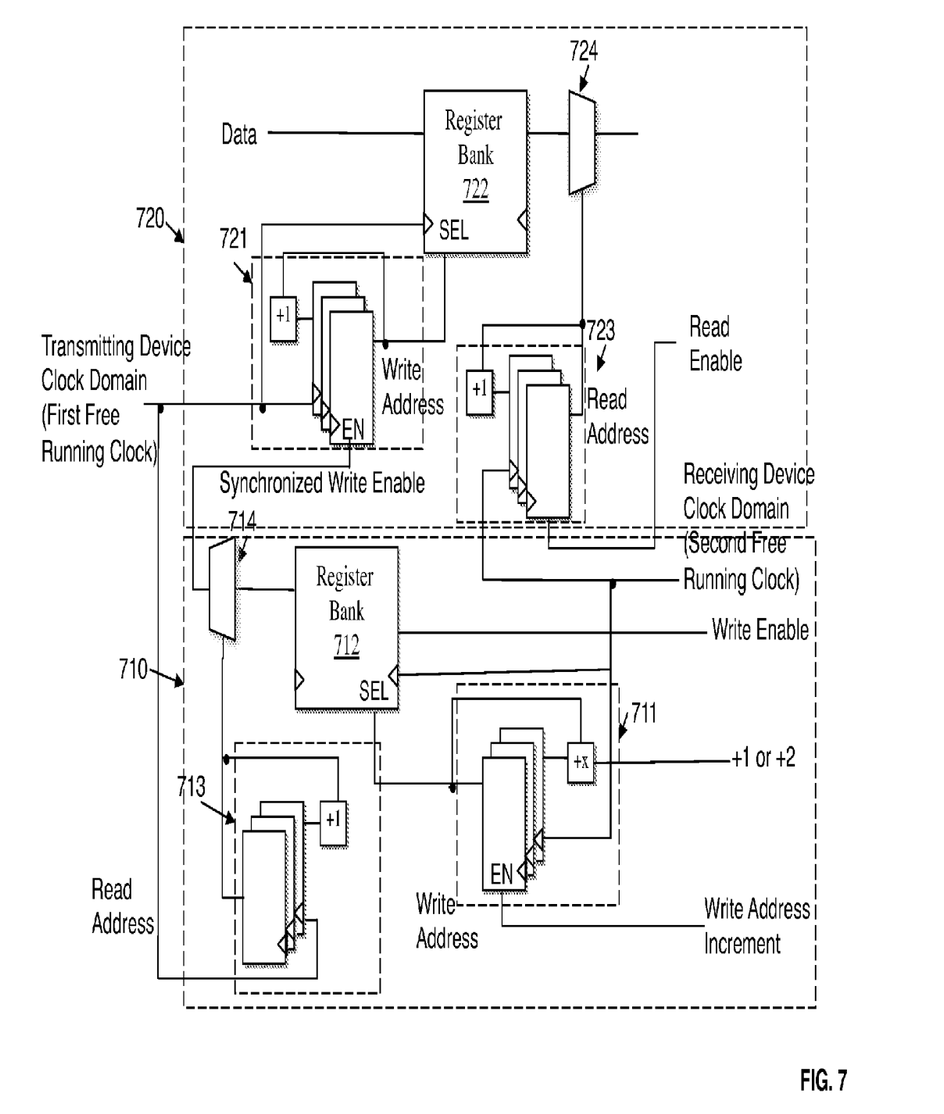
FIG. 7 illustrates components in FIFOs of a source synchronous capture unit operable to synchronize data transmitted along with a free running clock according to an exemplary embodiment of the present invention.

FIG. 7 illustrates components in FIFOs of a source synchronous capture unit operable to synchronize data originating from a domain utilizing a free running clock according to an exemplary embodiment of the present invention. The components illustrated in FIG. 7 may be used to implement the first FIFO 652 and the second FIFO 651 in FIG. 6. A first plurality of components is used to implement a first FIFO (enable FIFO) 710 for synchronizing a write enable signal received from a receiving device clock domain to a transmitting device clock domain. According to an embodiment of the present invention, the write enable signal is generated in response to a read operation by the receiving device. A plurality of registers and an adder are used to implement a write counter 711 for the first FIFO 710. The write counter 711 receives a second free running clock signal from the receiving device clock domain and increments a counter value with every rising or falling edge of the second free running clock signal.

A register bank 712 for the first FIFO 710 is coupled to the write counter 711 and receives a write address at its select input from the write counter 711. The write address selects an appropriate location in the register bank 712 to store write enable signals generated by the receiving device.

A plurality of registers and an adder are used to implement a read counter 713 for the first FIFO 710. The read counter 713 receives a first free running clock signal from the transmitting device clock domain and increments a counter value with every rising or falling edge of the first free running clock signal.

A selector 714 for the first FIFO 710 is coupled to the read counter 713 and receives a read address at its select input from the read counter 713. The read address selects an appropriate output received from the register bank 712 to transmit. The output of the selector 714 is a synchronized write enable signal that is synchronized to the clock domain of the transmitting device.

A second plurality of components is used to implement a second FIFO (data FIFO) 720 for synchronizing data received from the transmitting device clock domain to the receiving device clock domain. A plurality of registers and an adder are used to implement a write counter 721 for the second FIFO 720. The write counter 721 receives a first free running clock signal from the transmitting device clock domain and increments a counter value in response to the first free running clock signal and the synchronized write enable signal output from the selector 714.

A register bank 722 for the second FIFO 720 is coupled to the write counter 721 and receives a write address at its select input from the write counter 721. The write address selects an appropriate location in the register bank 722 to store data received from the transmitting device. By generating a write address in response to the synchronized write enable signal, data is written into the register bank 722 when valid data is returned from the transmitting device.

A plurality of registers and an adder are used to implement a read counter 723 for the second FIFO 720. The read counter 723 receives the second free running clock signal from the receiving device clock domain and increments a counter value in response to the second free running clock signal and a read enable signal from the receiving device.

A selector 724 for the second FIFO 720 is coupled to the read counter 723 and receives a read address at its select input from the read counter 723. The read address selects an appropriate output received from the register bank 722 to transmit. The output of the selector 724 is a synchronized data that is synchronized to the clock domain of the receiving device.

According to an embodiment of the present invention, the latency of the first FIFO 710 may be adjusted to ensure that write enable signals emerge in a corresponding cycle of the first free running clock to enable the second FIFO to latch the appropriate data. This may be achieved by using the +1 or +2 input and write address increment signals inputted to the write counter 711. When data is written into the second FIFO (data FIFO) 720, it is read out in response to a read enable signal. According to an embodiment of the present invention, the timing of the read enable signal is also calibrated to minimize latency while providing sufficient guardband to prevent under run if data arrives late. According to an embodiment of the present invention, the calibration procedure described in U.S. patent application Ser. No. 13/151,245 entitled "Method and Apparatus for Supporting Low-Latency External Memory Interfaces for Integrated Circuits" filed on Jun. 1, 2011, (which claims priority to provisional application 61/396,717 filed on Jun. 2, 2010) which is incorporated by reference, may be used to calibrate first FIFO 710. If the minimum latency the calibration procedure finds is larger than the latency required to have the write enable signal emerge in the corresponding cycle of the first free-running clock, some embodiments may make adjustments to command-path latencies to compensate, while others will issue an error.

It is appreciated that minor modifications may be made to the configuration of components illustrated in FIGS. 6 and 7 to support a source synchronous capture unit that synchronizes data originating from a domain utilizing a non-free running clock.

Figure 8:
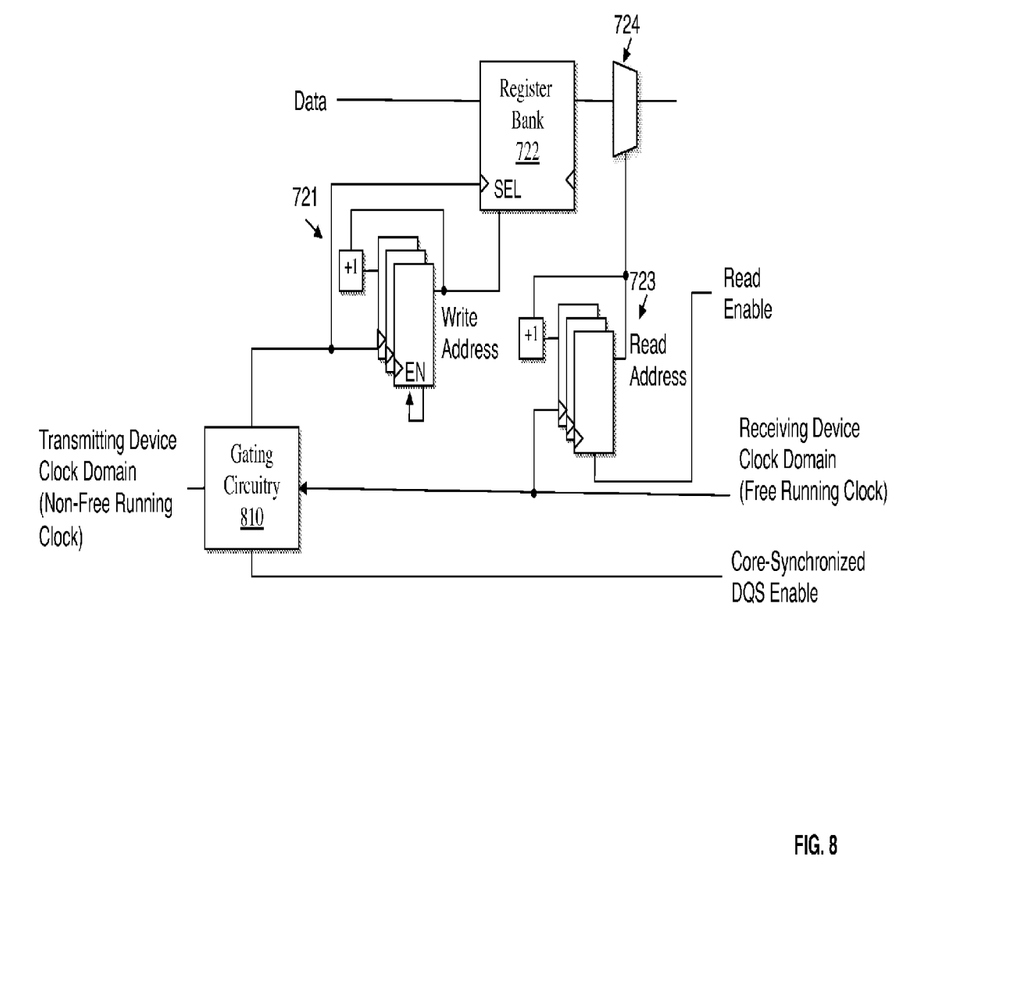
FIG. 8 illustrates components in FIFOs of a source synchronous capture unit operable to synchronize data transmitted with a non-free running clock according to an exemplary embodiment of the present invention.

FIG. 8 illustrates components in a FIFO of a source synchronous capture unit operable to synchronize data originating from a domain utilizing a non-free running clock according to an exemplary embodiment of the present invention. Transmitting devices utilizing non-free running clocks, such as strobe-reliant memory interfaces like DDR, toggles strobes when data is sent. Since the strobes are toggled when data is valid, synchronized write enable signals need not be generated. Thus, the components supporting the first FIFO 710 in FIG. 7 may be removed and the enable input on write counter 721 may be tied to true. Gating circuitry 810 may be implemented to gate raw non-free running clock signals in the event a signal goes tri state, in response to a core-synchronized DQS enable signal. Write counter 721, register bank 722, read counter 723, and selector 724 in FIG. 8 operate similarly to their corresponding components in FIG. 7.

According to an embodiment of the present invention, the source synchronous capture unit is operable to interface with devices that transmit data with either a free running clock signal or a non-free running clock signal with minor modifications to its operability. Due to the flexibility of the design of the source synchronous capture units illustrated in FIGS. 6, 7, and 8, the modifications may be made during design of the source synchronous capture unit or during operation of the source synchronous capture unit. To modify the operability of the source synchronous capture unit during operation, both the data FIFO and enable FIFO may be implemented on a circuit and the user is given an option to select whether to use the enable FIFO to synchronize a write enable signal.

According to an embodiment of the present invention, a calibration technique may be used to determine when the read enable signals illustrated in FIGS. 7 and 8 are generated to achieve consistent and reliable data transfer with low latency. This is different than the synchronization-based approach described with respect to FIG. 5. Calibration based data FIFOs are advantageous when synchronization latency is large. Calibration-based data FIFOs that are far from a central controller/scheduler may be fed by pipelined read enable signals whose latency is adjusted based on calibration results to avoid broadcast latency penalties between the controller/scheduler and the FIFOs. According to an embodiment of the present invention, synchronizer chains are used to assist FIFO calibration. When data is written into the FIFO, a signal can be sent to the read side through a synchronizer, similar to FIG. 5. Once the signal is synchronized, the read side can use that information to calibrate when it is safe to read out of the FIFO. The appropriate guardband/latency can be added and/or latency through the synchronizer can be factored out.

It is appreciated that synchronization-based approach described with respect to FIG. 5 may be used in place of calibration. For example, a write counter resynchronization unit such as the one described with reference to FIG. 5 may be used instead of performing calibration to avoid FIFO underrun and minimize latency.

Data FIFOs may be used to perform rate conversion in addition to synchronization. For example, data written into a data FIFO may have a different width and rate than the data read from the data FIFO. According to an embodiment of the present invention, 32 bits of data may be written into a data FIFO every clock cycle of a transmitting device, and 64 bits of data may be read out of the data FIFO every clock cycle of the receiving device. In order to achieve this, the write address would be 1 bit longer than the read address. Furthermore, the selector used for selecting data from the register bank of the data FIFO would be structured to read out wider words than the write address selects. Similarly, two write enable bits may be written into the enable FIFO every clock cycle of the receiving device while one write enable bit may be read out of enable FIFO every clock cycle of the transmitting device.

It is appreciated that embodiments of the source synchronous capture units illustrated in FIGS. 6-8 may be modified to increase the transmitting-device clock rate supported. This may be achieved by dividing each respective FIFO into two FIFOs that latch data off different edges (rising and falling, similar to that illustrated in FIG. 4) of a half-rate clock created by dividing the strobe or clock coming from the transmitting device. Data is read out of the two FIFOs using a half-rate clock from the receiving device. As a result, the maximum clock rate on the write side of the data FIFO is reduced. This technique may be applied to the write side of the data FIFO and the read side of the enable FIFO to reduce how fast those FIFO ports need to operate.

Figure 9:
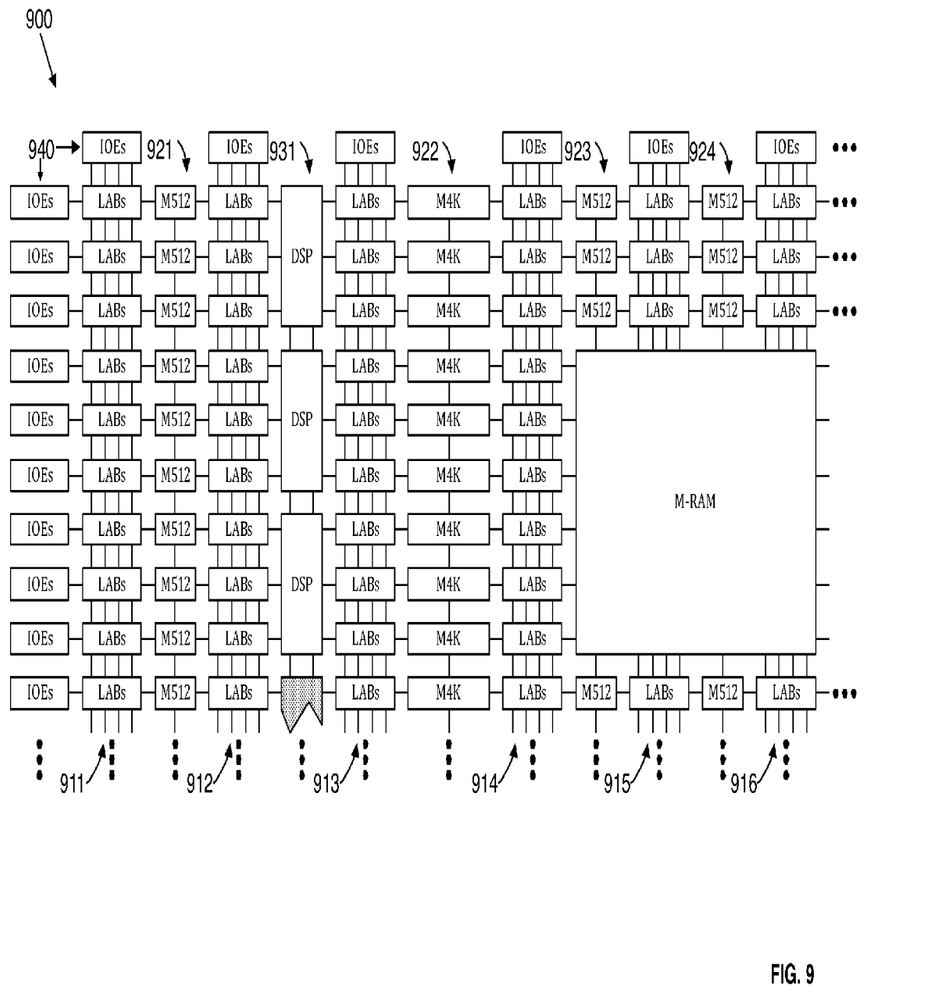
FIG. 9 illustrates a target device in which the source synchronous capture unit may be implemented on according to an exemplary embodiment of the present invention.

FIG. 9 illustrates a target device 900 in which the source synchronous capture unit may be implemented on according to an exemplary embodiment of the present invention. The target device 900 is an FPGA having a chip with a hierarchical structure that may take advantage of wiring locality properties of circuits formed therein.

The target device 900 includes a plurality of logic-array blocks (LABs). Each LAB may be formed from a plurality of logic blocks, carry chains, LAB control signals, (lookup table) LUT chain, and register chain connection lines. A logic block is a small unit of logic providing efficient implementation of user logic functions. A logic block includes one or more combinational cells and registers. According to one embodiment of the present invention, the logic block may operate similarly to a logic element (LE), or adaptive logic module (ALM), such as those found in Stratix II/III/IV devices manufactured by Altera® Corporation, or a slice such as those found in Virtex devices manufactured by Xilinx Inc. In this embodiment, the logic block may include a four input lookup table (LUT) with a configurable register. Columns of LABs are shown as 911-916. It should be appreciated that the logic block may include additional or alternate components.

The target device 900 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 900. Columns of memory blocks are shown as 921-924.

The target device 900 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the target device 900 and are shown as 931.

The target device 900 includes a plurality of input/output elements (IOEs) 940. Each IOE feeds an I/O pin (not shown) on the target device 900. The IOEs may be located at the end of LAB rows and columns around the periphery of the target device 900. Each IOE includes a bidirectional I/O buffer and a plurality of registers for registering input, output, and output-enable signals.

The target device 900 includes LAB local interconnect lines (not shown) that transfer signals between LEs in the same LAB. The LAB local interconnect lines are driven by column and row interconnects and LE outputs within the same LAB. Neighboring LABs, memory blocks, or DSP blocks may also drive the LAB local interconnect lines through direct link connections. The target device 900 also includes a plurality of row and column interconnect lines (not shown) that span fixed distances. Dedicated row and column interconnect lines, route signals to and from LABs, DSP blocks, and memory blocks within the same row and column, respectively.

With respect to the components illustrated in FIGS. 3, 4, and 6, the data register unit and delay/divider unit may be implemented at the input/output periphery (the IOEs in FIG. 9) and the FIFO(s) may be implemented at the core of an FPGA (using the non-IOE blocks in FIG. 9). It should be appreciated that the data register unit, the delay/divider unit, and the FIFOs may be implemented at other locations on the FPGA. For example, in some embodiments, the delay/divider unit may be implemented in the core of the FPGA.

FIG. 9 illustrates an exemplary embodiment of a target device. It should be appreciated that a system may include a plurality of target devices, such as that illustrated in FIG. 9, cascaded together. It should also be appreciated that the target device may include FPGA resources arranged in a manner different than that on the target device 900. A target device may also include FPGA resources other than those described in reference to the target device 900. Thus, while the invention described herein may be utilized on the architecture described in FIG. 9, it should be appreciated that it may also be utilized on different architectures.

In the foregoing specification, embodiments of the invention have been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A source synchronous capture unit on a receiving circuit comprising:
   a data register unit that synchronizes data, arriving from a memory external to the receiving circuit, to an edge of a first clock, wherein the first clock is associated with the memory;
   a first first-in-first-out (FIFO) unit that synchronizes a write enable signal with the first clock to generate a synchronized write enable signal; and
   a second FIFO unit that stores the data synchronized by the data register unit in response to the edge of the first clock and the synchronized write enable signal.

2. The source synchronous capture unit of claim 1, wherein the synchronized write enable signal indicates to the second FIFO unit whether data arriving from the memory is valid data.

3. The source synchronous capture unit of claim 1, wherein the first FIFO unit comprises:
   a register bank;
   a write counter that generates an address in the register bank used to store the write enable signal in response to the second clock; and
   a read counter that generates an address in the register bank used to read the write enable signal in response to the first clock.

4. The source synchronous capture unit of claim 1, wherein the second FIFO unit comprises:
   a register bank;
   a write counter that generates an address in the register bank used to store the data in response to the first clock and the synchronized write enable signal; and
   a read counter circuitry that generates an address in the register bank used to read the data in response to the second clock and a read enable signal.

5. The source synchronous capture unit of claim 4 further comprising:
   a write counter resynchronization unit that determines whether new data is available in the register bank.

6. The source synchronous capture unit of claim 5, wherein the write counter resynchronization unit determines a calibration value for the read enable signal.

7. The source synchronous capture unit of claim 1, wherein the second FIFO unit comprises a single FIFO that stores data in response to one of positive and negative edges of the first clock.

8. The source synchronous capture unit of claim 1, wherein the second FIFO unit comprises:
   a first FIFO that stores data in response to a negative edge of a divided clock generated from the first clock; and
   a second FIFO that stores data in response to a positive edge of the divided clock generated from the first clock.

9. The source synchronous capture unit of claim 7, wherein the single FIFO stores data comprising words of length N, and the single FIFO reads out data comprising words of length 2N at half the rate of the first clock.

10. The source synchronous capture unit of claim 1, wherein the first FIFO unit comprises a FIFO that synchronizes the write enable signal to one of a positive and negative edge of a divided clock generated from the first clock.

11. The source synchronous capture unit of claim 10, wherein the second FIFO unit comprises a FIFO that stores the data from the memory in response to the one of a positive and negative edge of the divided clock generated from the first clock and the synchronized write enable signal.

12. The source synchronous capture unit of claim 1, wherein the data register unit comprises a first flip-flop coupled to a first line and a second line, and a second flip-flop coupled to the first line and an inversion of the second line, wherein the first line transmits the data and the second line transmits the first clock.

13. The source synchronous capture unit of claim 1 further comprising a gating circuit coupled to the output of the first FIFO unit, wherein the gating circuit drives the write enable signal high in response to a determination that the first clock is a strobe.

14. The source synchronous capture unit of claim 1, wherein the write enable signal is generated in response to a read operation by the receiving circuit.

15. The source synchronous capture unit of claim 1, wherein the second FIFO unit outputs the data in response to a second clock associated with the receiving circuit and a read enable signal.

16. The source synchronous capture unit of claim 1, wherein the second FIFO unit disregards invalid data in response to the synchronized write enable signal.

17. The source synchronous capture unit of claim 1, wherein the second FIFO unit is directly connected to the second clock.

18. A system, comprising:
    a transmitting device that transmits data; and
    a receiving device that receives the data, the receiving device includes a data register unit that synchronizes data, arriving from a memory external to the receiving device, to an edge of a first clock, wherein the first clock is associated with the memory, a first first-in-first-out (FIFO) unit that synchronizes a write enable signal with the first clock, and a second FIFO unit that stores the data synchronized by the data register unit in response to the edge of the first clock and the synchronized write enable signal.

19. The system of claim 18, wherein the receiving device comprises a field programmable gate array (FPGA) device.

20. The system of claim 18, wherein the transmitting device is a memory component on a separate semiconductor substrate than the receiving device.

21. The system of claim 18, wherein the synchronized write enable signal indicates to the second FIFO unit whether the data from the memory is valid data.

22. The system of claim 18, wherein the first FIFO unit comprises:
- a register bank;
- a write counter that generates an address in the register bank used to store the write enable signal in response to the second clock; and
- a read counter that generates an address in the register bank used to read the write enable signal in response to the first clock.

23. The system of claim 18, wherein the second FIFO unit comprises:
- a register bank;
- a write counter that generates an address in the register bank used to store the data in response to the first clock and the synchronized write enable signal; and
- a read counter that generates an address in the register bank used to read the data in response to the second clock and the read enable signal.

24. A method for managing data comprising:
- synchronizing data, arriving from a memory, to an edge of a first clock associated with the memory;
- synchronizing a write enable signal to generate a synchronized write enable signal that is synchronized with the first clock;
- storing the data in response to the edge of the first clock and the synchronized write enable signal; and
- outputting the data in response to a second clock associated with a receiving circuit and a read enable signal to generate data synchronized with the second clock.

25. The method of claim 24, wherein synchronizing the write enable signal comprises:
- storing the write enable signal into a data storage buffer in response to the second clock; and
- outputting the synchronized write enable signal from the data storage buffer in response to the first clock.

26. The method of claim 24, wherein storing the data comprises writing the data into a first-in-first-out (FIFO) in response to a positive or negative edge of the first clock.

27. The method of claim 24, wherein storing the valid data comprises:
- writing a first word of the data into a first first-in-first-out (FIFO) unit in response to a negative edge of a divided clock generated from the first clock; and
- writing a second word of the data into a second FIFO unit in response to a positive edge of the divided clock generated from the first clock.

28. The method of claim 24, wherein the write enable signal is generated in response to a read operation by the receiving circuit.

* * * * *